United States Patent
Lu (10) Patent No.: US 9,509,298 B2
(45) Date of Patent: Nov. 29, 2016

(54) DRIVING MODULE AND DISPLAY DEVICE THEREOF

(71) Applicant: Sitronix Technology Corp., Hsinchu County (TW)

(72) Inventor: Hung-Yu Lu, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 68 days.

(21) Appl. No.: 14/513,201

(22) Filed: Oct. 13, 2014

(65) Prior Publication Data

US 2015/0256167 A1    Sep. 10, 2015

Related U.S. Application Data

(60) Provisional application No. 61/948,031, filed on Mar. 5, 2014.

(30) Foreign Application Priority Data

Aug. 8, 2014  (TW) .............................. 103127378 A (51) Int. Cl.
| | |
|---|---|
| H03K 17/0812 | (2006.01) |
| G09G 3/36 | (2006.01) |
| H03K 17/14 | (2006.01) |
| H03K 17/30 | (2006.01) |

(52) U.S. Cl.
CPC ...... *H03K 17/08122* (2013.01); *G09G 3/3677* (2013.01); *G09G 3/3696* (2013.01); *H03K 17/145* (2013.01); *H03K 17/302* (2013.01); *G09G 2310/0264* (2013.01)

(58) Field of Classification Search
CPC ............. G09G 3/3674; G09G 3/3677; G09G 3/3696; G09G 3/3685; G09G 3/3688; H03K 17/102
See application file for complete search history.

(56) References Cited

U.S. PATENT DOCUMENTS 6,664,809 B1 * 12/2003 Chiu ................ H03K 3/356113
                                                                    326/68

FOREIGN PATENT DOCUMENTS

| | | |
|---|---|---|
| JP | 200049584 A | 2/2000 |
| TW | 347901 | 12/1998 |
| TW | 200823849 | 6/2008 |
| TW | 201220949 | 5/2012 |
| TW | 201322235 | 6/2013 |

* cited by examiner

*Primary Examiner* — Quan-Zhen Wang
*Assistant Examiner* — Dong Hui Liang
(74) *Attorney, Agent, or Firm* — Winston Hsu; Scott Margo (57) ABSTRACT

A driving module, for a display device, includes a first transistor comprising a gate coupled to a first node, a drain coupled to an output end, and a source coupled to a first positive voltage source; a second transistor comprising a gate coupled to a second node, a drain coupled to the output end, and a source coupled to a first negative voltage source; and a voltage generating unit, coupled to an input end, a second positive voltage source and a second negative voltage source for generating a first voltage at the first node and a second voltage at the second node; wherein a difference between a first positive voltage of the first positive voltage source and the first voltage is smaller than a first threshold and a difference between a first negative voltage of the first negative voltage source and the second voltage is smaller than a second threshold.

4 Claims, 7 Drawing Sheets

DRIVING MODULE AND DISPLAY DEVICE THEREOF

CROSS REFERENCE TO RELATED APPLICATIONS

This application claims the benefit of U.S. Provisional Application No. 61/948,031, filed on Mar. 5, 2014 and incorporated herein by reference.

BACKGROUND OF THE INVENTION

1. Field of the Invention

The present invention relates to a driving module and display device thereof, and more particularly, to a driving module realized without components of the traditional high-voltage process and display device thereof.

2. Description of the Prior Art

A liquid crystal display (LCD) is a flat panel display which has the advantages of low radiation, light weight and low power consumption and is widely used in various information technology (IT) products, such as notebook computers, personal digital assistants (PDA), and mobile phones. An active matrix thin film transistor (TFT) LCD is the most commonly used transistor type in LCD families, and particularly in the large-size LCD family. A driving system installed in the LCD includes a timing controller, source drivers and gate drivers. The source and gate drivers respectively control data lines and scan lines, which intersect to form a cell matrix. Each intersection is a cell including crystal display molecules and a TFT. In the driving system, the gate drivers are responsible for transmitting scan signals to gates of the TFTs to turn on the TFTs on the panel. The source drivers are responsible for converting digital image data, sent by the timing controller, into analog voltage signals and outputting the voltage signals to sources of the TFTs. When a TFT receives the voltage signals, a corresponding liquid crystal molecule has a terminal whose voltage changes to equalize the drain voltage of the TFT, which thereby changes its own twist angle. The rate that light penetrates the liquid crystal molecule is changed accordingly, allowing different colors to be displayed on the panel.

In general, the gate driver needs to generate scan signals with an enormous voltage range, to turn on the transistors of the LCD. Thus, an output stage of the traditional gate driver needs to be realized by transistors of a high-voltage process, for avoiding the huge voltage difference between different nodes of the transistor damages the transistor when generating the scan signals with the enormous voltage range. However, the manufacture cost of the driving system would be significantly increased by using the transistors of the high-voltage process. How to reduce a number of the high-voltage process transistors used for realizing the gate driver becomes a topic to be discussed.

SUMMARY OF THE INVENTION

In order to solve the above problem, the present invention provides a driving module realized without traditional high-voltage process components and display device thereof.

The present invention discloses a driving module for a display device, comprising a first transistor, comprising a gate coupled to a first node, a drain coupled to an output end, and a source coupled to a first positive voltage source; a second transistor, comprising a gate coupled to a second node, a drain coupled to the output end, and a source coupled to a first negative voltage source; and a voltage generating unit, coupled to an input end, a second positive voltage source and a second negative voltage source for generating a first voltage at the first node and a second voltage at the second node; wherein a voltage difference between a first positive voltage of the first positive voltage source and the first voltage is smaller than a first threshold and a voltage difference between a first negative voltage of the first negative voltage source and the second voltage is smaller than a second threshold.

The present invention further discloses a display device, comprising a plurality of displaying components, drove by a plurality of driving signals; and a plurality of driving modules, wherein each of the plurality of driving modules comprises a first transistor, comprising a gate coupled to a first node, a drain coupled to an output end, and a source coupled to a first positive voltage source; a second transistor, comprising a gate coupled to a second node, a drain coupled to the output end, and a source coupled to a first negative voltage source; and a voltage generating unit, coupled to an input end, a second positive voltage source and a second negative voltage source for generating a first voltage at the first node and a second voltage at the second node; wherein a voltage difference between a first positive voltage of the first positive voltage source and the first voltage is smaller than a first threshold and a voltage difference between a first negative voltage of the first negative voltage source and the second voltage is smaller than a second threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
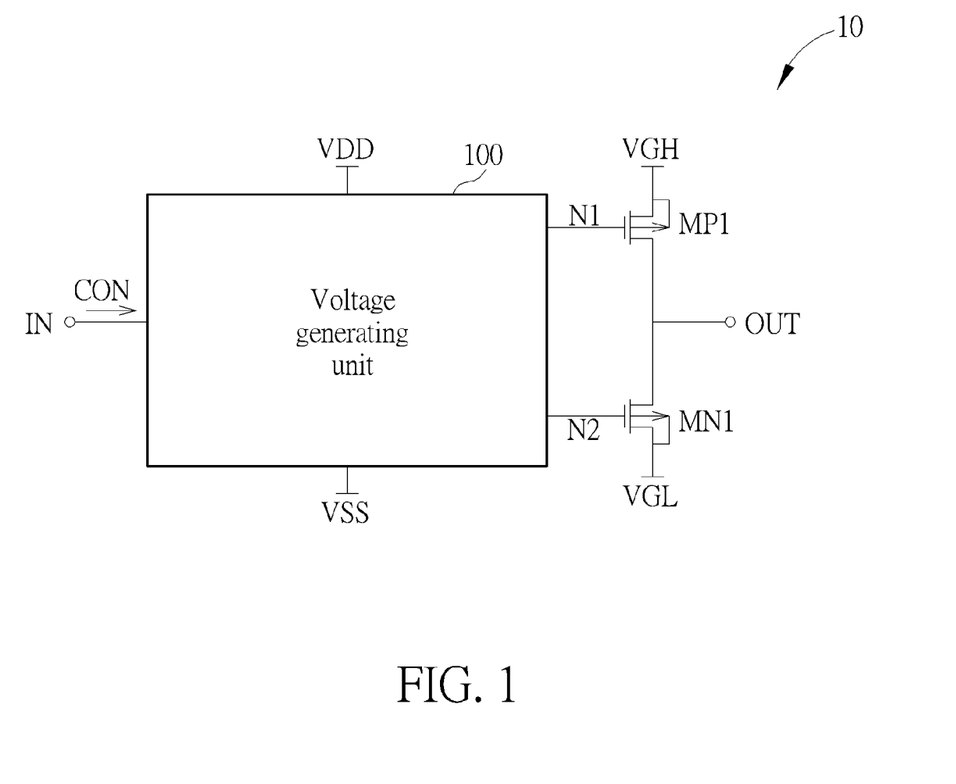
FIG. 1 is a schematic diagram of a driving module according to an embodiment of the present invention.

Please refer to FIG. 1, which is a schematic diagram of a driving module 10 according to an embodiment of the present invention. The driving module 10 may be a gate driver for driving scan lines in a display device such as a liquid crystal display (LCD), a smart television or a smart phone, and is not limited herein. As shown in FIG. 1, the driving module 10 comprises transistors MP1, MN1 and a voltage generating unit 100. The coupling relationships between the transistors MP1 and MN1 are narrated as the following. The gate, the source and the drain of the transistor MP1 are coupled to a node N1, a positive voltage source VGH and an output end OUT, respectively, and the gate, the source and the drain of the transistor MN1 are coupled to a node N2, a negative voltage source VGL and the output end OUT, respectively. The voltage generating unit 100 is coupled to an input end IN, a positive voltage source VDD and a negative voltage source VSS, wherein a voltage of the positive voltage source VDD is smaller that of the positive voltage source VGH and a voltage of the negative voltage source VSS is greater than that of the negative voltage source VGL. According to a control signal CON received from the input end IN, the voltage generating unit 100 generates appropriate voltages VN1 and VN2 at the nodes N1 and N2, respectively, to control the conducting statuses of the transistors MP1 and MN1 and to generate an appropriate output voltage VOUT at the output end OUT as a driving signal of a display component (e.g. a scan line) in the display device.

In order to drive the display component of the display device, the output voltage VOUT is required to equip with variations within an enormous voltage range. For example, the voltage of the positive voltage source VGH may be 15 volts and the voltage of the negative voltage source VGL may be −15 volts. That is, a voltage difference between the source and the drain of the transistor MP1 becomes 30 volts when the output voltage VOUT is −15 volts; and a voltage difference between the source and the drain of the transistor MN1 is also 30 volts when the output voltage VOUT is 15 volts. Thus, the transistors MP1 and MN1 are required to be implemented by a special process which allows the transistors MP1 and MN1 not to be damaged by a huge voltage difference across the source and the drain. Different from the traditional high-voltage process, although the transistors MP1 and MN1 of the special process can endure the huge voltage difference across the source and the drain and the huge voltage difference between the gate and the drain, the transistors MP1 and MN1 of the special process would be damaged by a huge voltage difference between the gate and the source. In such a condition, the driving module 10 utilizes the voltage generating unit 100 to generate the voltages VN1 and VN2 and to limit the voltage across the gate and the source of each of the transistors MP1 and MN1 not to be greater than a threshold TH (e.g. 5 volts). The limitations on the voltage across the gate and the source of each of the transistors MP1 and MN1 prevent the transistors MP1 and MN1 from being damaged.

Figure 2:
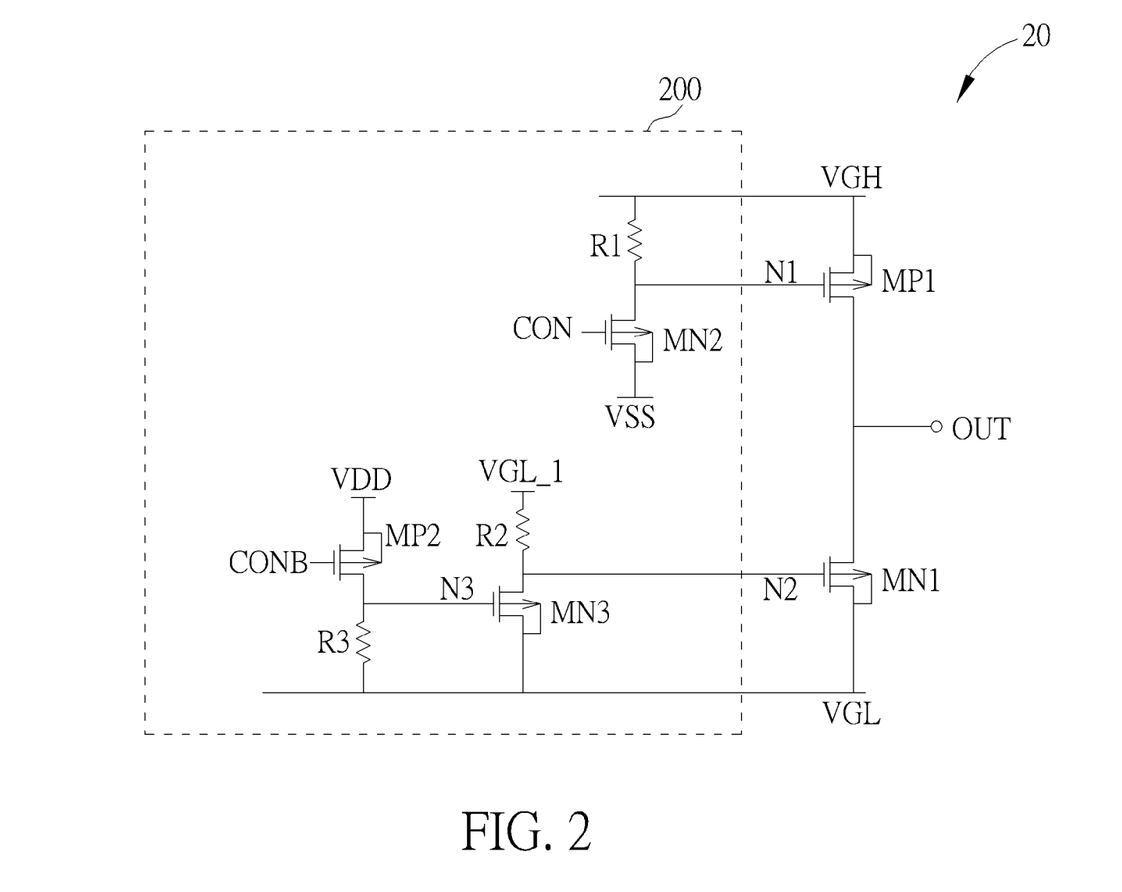
FIG. 2 is a schematic diagram of another driving module according to an embodiment of the present invention.

According to different applications and different design concepts, the implementation methods of the voltage generating unit 100 may be appropriately altered and modified. Please refer to FIG. 2, which is a schematic diagram of a driving module 20 according to an embodiment of the present invention. The driving module 20 shown in FIG. 2 is similar to the driving module 10 shown in FIG. 1, thus the components with similar functions use the same symbols. The driving module 20 comprises the transistors MP1, MN1 and a voltage generating unit 200, wherein the coupling relationships between the transistors MP1 and MN1 are similar to those between the transistors MP1 and MN1 shown in FIG. 1. The voltage generating unit 200 comprises resistors R1-R3 and transistors MN2, MN3 and MP2. The resistor R1 is coupled between the positive voltage source VGH and the node N1. The gate, the source and the drain of the transistor MN2 are respectively coupled to the input end IN (i.e. the control signal CON), the negative voltage source VSS (e.g. ground) and the node N1. When the control signal CON indicates turning off the transistor MP1, the control signal CON turns off the transistor MN2 (i.e. the control signal CON disconnects the connection between the node N1 and the negative voltage source VSS when the control signal CON indicates disconnecting the connection between the output end OUT and the positive voltage source VGH), to make the voltage VN1 to be equal to the voltage of the positive voltage source VGH. In such a condition, the voltage across the gate and the source of the transistor MP1 is 0. The transistor MP1 is turned off and would not be damaged. When the control signal CON indicates turning on the transistor MP1, the control signal CON turns on the transistor MN2 for generating an appropriate current passing through the resistor R1, so as to turn on the transistor MP1. The voltage difference between the voltage VN1 turning on the transistor MP1 and the voltage of the positive voltage source VGH (i.e. the voltage across the resistor R1) is smaller than or equal to the threshold TH, for turning on the transistor MP1 and avoiding the transistor MP1 is damaged simultaneously.

On the other hand, the resistor R2 is coupled between a negative voltage source VGL_1 and the node N2. The gate, the source and the drain of the transistor MN3 are respectively coupled to a node N3, the negative voltage source VGL and the node N2. The resistor R3 is coupled between the negative voltage source VGL and the node N3. The gate, the source and the drain of the transistor MP2 are coupled to an inverse signal CONB of the control signal CON, the positive voltage source VDD and the node N3. Note that, a voltage difference between the negative voltage sources VGL_1 and VGL is smaller than or equal to the threshold TH and the voltage difference between the negative voltage sources VGL_1 and VGL is greater than a threshold voltage of the transistor MN1. For example, when the threshold TH is 5 volts, the voltage of the negative voltage source VGL_1 may be that of the negative voltage source VGL increases 5 volts (i.e. VGL_1=VGL+5). In addition, the inverse signal CONB may be acquired by inversing the control signal CON via an inverter (not shown in FIG. 2). Utilizing the inverter to inverse signals should be well known to those with ordinary skill in the art, and is not narrated herein for brevity.

When the control signal CON indicates turning off the transistor MN1, the inverse signal CONB turns on the transistor MP2 and a current passes through the resistor R3, to generate an appropriate voltage VN3 at the node N3 and to turn on the transistor MN3. In such a condition, a current flows from the negative voltage source VGL_1 to the node N2 and passes through the resistor R2. The voltage VN2 of the node N2 equals a difference between the voltage of the negative voltage source VGL_1 and a voltage across the resistor R2. Via adjusting the current value of the current passing through the resistor R2 and the resistance of the resistor R2, the voltage difference between the voltage VN2 and the voltage of the negative voltage source VGL is smaller than the threshold voltage of the transistor MN1, to achieve the goal of turning off the transistor MN1. When the control signal CON indicates turning on the transistor MN1, the inverse signal CONB turns off the transistor MP2. The voltage difference between the gate and the source of the transistor MN3 becomes 0 and the transistor MN3 is in the cut off status. Under such a condition, the voltage VN2 of the node N2 equals the voltage of the negative voltage source VGL_1. Since the voltage difference between the voltages of the negative voltage sources VGL_1 and VGL is greater than the threshold voltage of the transistor MN1, the transistor MN1 would be turned on. Note that, the transistor MN1 is not damaged since the voltage difference between the voltages of the negative voltage sources VGL_1 and VGL is smaller than or equal to the threshold TH. Via the voltage generating unit 200, the driving module 20 can switch the conducting statuses of the transistors MP1 and MN1 according to the control signal CON and generate the output voltage VOUT at the output end OUT as the driving signal utilized for driving the display components of the display device. Further, the voltage generating unit 200 limits the voltage differences between the gate and the source of each of the transistors MP1 and MN1 to be lower than threshold TH, to avoid the transistors MP1 and MN1 are damaged.

In this embodiment, the transistor MN2 needs to be realized in the special process due to that the voltage difference between the node N1 and the negative voltage source VSS may be enormous. The voltage difference between the control signal CON and the negative voltage source VSS also cannot exceed the threshold TH. For example, when the negative voltage source VSS is ground and the threshold TH is 5 volts, the voltage range of the control signal CON is between 5 volts and the ground voltage. Similarly, the transistor MP2 needs to be realized in the special process since the voltage difference between the node N3 and the positive voltage source VSS may be enormous.

Figure 3:
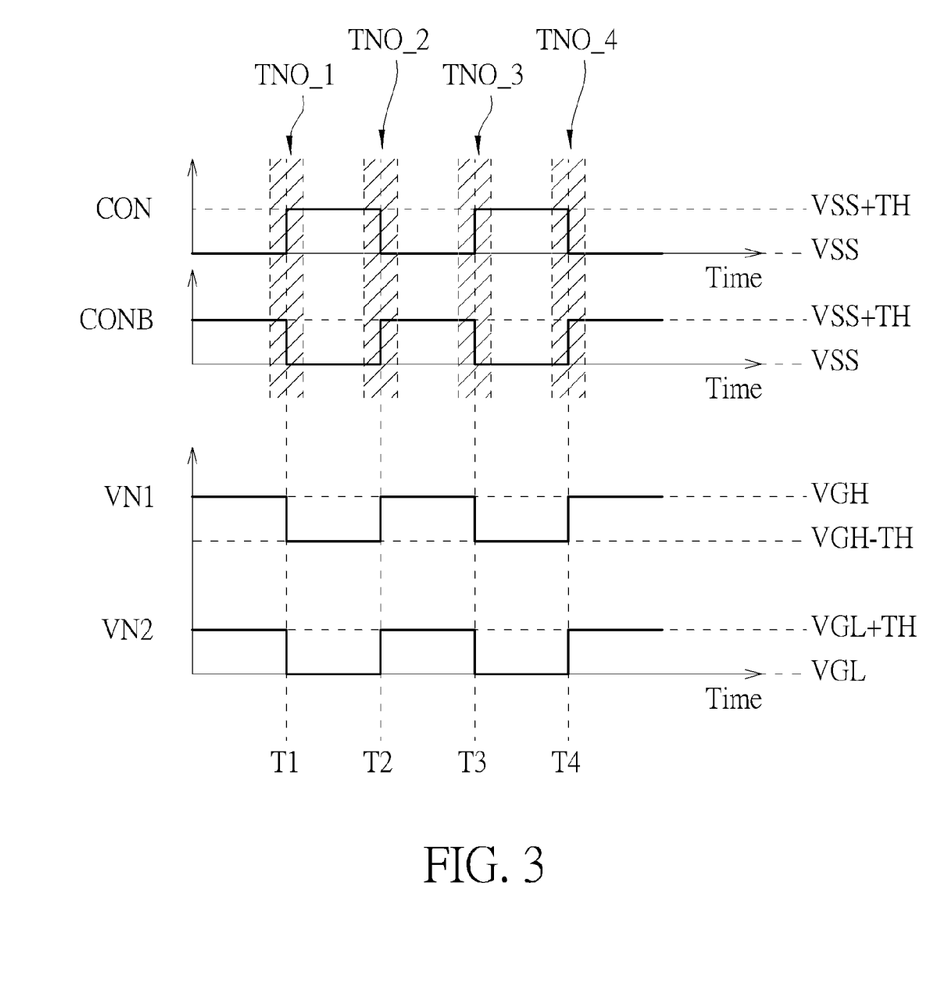
FIG. 3 is a schematic diagram of related signals when the driving module shown in FIG. 2 operates.

Please refer to FIG. 3, which is a timing diagram of related signals when the driving module 20 shown in FIG. 2 operates. As shown in FIG. 3, the voltage of the control signal CON equals a sum of the voltage of the negative voltage source VSS and the threshold TH and the voltage of the inverse signal CONB is that of the negative voltage source VSS between times T1 and T2, to indicate turning on the transistor MP1 and turning off the transistor MN1. According to the control signal CON, the transistor MN2 is turned on between the times T1 and T2 such that the voltage VN1 substantially equals the voltage of the positive voltage source VGH minus the threshold TH and turns on the transistor MP1. In addition, the transistors MP2 and MN3 are turned on between the times T1 and T2 according to the inverse signal CONB, such that the voltage VN2 of the node N2 substantially equals to the voltage of the negative voltage source VGL and turns off the transistor MN1. The voltage of the control signal CON is that of the negative voltage source VSS and the voltage of the inverse signal CONB equals a sum of the voltages of the negative voltage source VSS and the threshold TH between the times T2 and T3, to indicate turning off the transistor MP1 and turning on the transistor MN1. The transistor MN2 is turned off between the times T2 and T3 according to the control signal CON, to make the voltage VN1 of the node N1 to be equal to the voltage of the positive voltage source VGH and to turn off the transistor MP1. In addition, the transistors MP2 and MN3 are turned off between the times T2 and T3 according to the inverse signal CONB, to make the voltage VN2 of the node N2 to be the voltage of the negative voltage source VGL_1 (the voltage of the negative voltage source VGL_1 equals the sum of the voltage of the negative voltage source VGL and the threshold TH in this embodiment). The transistor MN1 is therefore turned on. Via the voltage generating unit 200, the driving module 20 switches the conducting statuses of the transistors MP1 and MN1 according to the control signal CON, to generate the appropriate output voltage VOUT at the output end OUT as the driving signal used for driving the display component in the display device. Furthermore, the voltage generating unit 200 limits the voltage difference between the gate and the source of each of the transistors MP1 and MN1 to be lower than the threshold TH, to avoid the transistor MP1 and MN1 are damaged.

Note that, the control signal CON and the inverse signal CONB may be non-overlapped for avoiding the driving module 20 works abnormally. Please refer to FIG. 3, which shows time periods TNO_1-TNO_4. In the time periods TNO_1-TNO_4, the rising edges and the falling edges of the control signal CON and the inverse signal are non-overlapped. For example, the designer may delay the rising edge of the control signal CON and/or advances the falling edge of the inverse signal CONB in the time period TNO_1.

Figure 4:
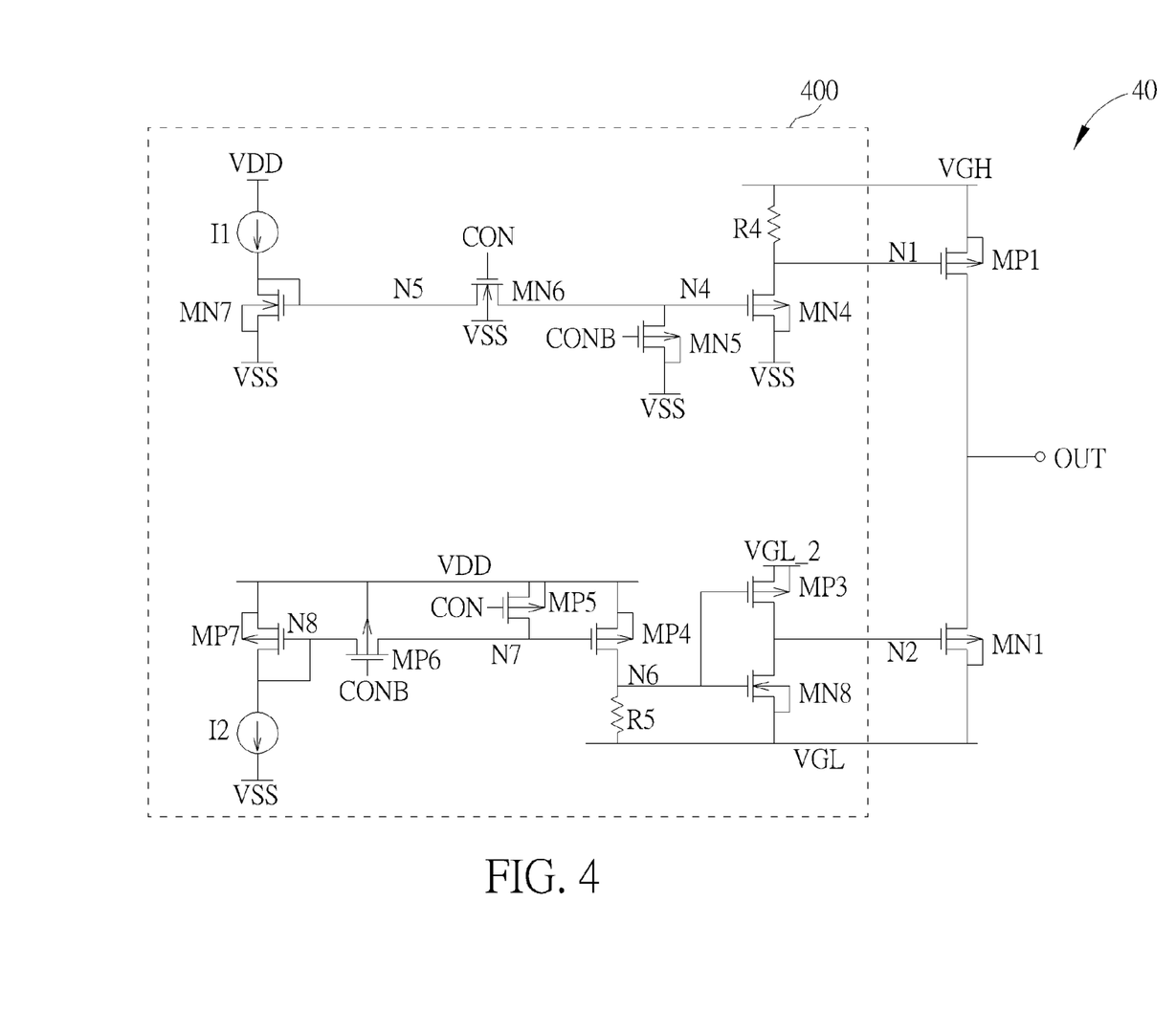
FIG. 4 is a schematic diagram of another driving module according to an embodiment of the present invention.

Please refer to FIG. 4, which is a schematic diagram of a driving module 40 according to an embodiment of the present invention. The driving module 40 shown in FIG. 4 is similar to the driving module 10 shown in FIG. 1, thus the components with the similar functions use the same symbols. The driving module 40 comprises the transistors MP1, MN1 and a voltage generating unit 400, wherein the coupling relationships between the transistors MP1 and MN1 are similar to those between the transistors MP1 and MN1 shown in FIG. 1. In the FIG. 4, the voltage generating unit 400 comprises transistors MN4-MN8, MP3-MP7, resistors R4, R5 and current sources I1, I2. The resistor R4 is coupled between the positive voltage source VGH and the node N1. The gate, the source and the drain of the transistor MN4 are respectively coupled to a node N4, the negative voltage source VSS (e.g. ground) and the node N1. The gate, the source and the drain of the transistor MN5 are respectively coupled to an inverse signal CONB of the control signal CON, the negative voltage source VSS and the node N4. The gate, the source and the drain of the transistor MN6 are respectively coupled to the control signal CON, a node N5 and the node N4. The gate, the source and the drain of the transistor MN7 are respectively coupled to the node N5, the negative voltage source VSS and the node N5. The current source I1 is coupled between the positive voltage source VDD and the node N5. The inverse signal CONB may be acquired by inversing the control signal CON via an inverter (not shown in FIG. 4). The principles of inversing the signal via the inverter should be well known to those with ordinary skill in the art, and are not described herein for brevity.

When the control signal CON indicates turning off the transistor MP1 (i.e. disconnecting the connection between the output end OUT and the positive voltage source VGH), the inverse signal CONB turns on the transistor MN5 and the control signal CON turns off the transistor MN6, to make the transistor MN4 to be in the cutoff status and the voltage VN1 of the node N1 to be equal to the voltage of the positive voltage source VGH. The transistor MP1 is turned off and is not damaged since the voltage across the gate and the source of the transistor MP1 is 0. When the control signal CON indicates turning on the transistor MP1, the inverse signal CONB turns off the transistor MN5 and the control signal CON turns on the transistor MN6, such that the transistors MN4 and MN7 form a current mirror and an appropriate current passes through the resistor R4 to generate the voltage VN1 at the node N1 for turning on the transistor MP1. Via The voltage difference between the voltage VN1 turning on the transistor MP1 and the voltage of the positive voltage source VGH (i.e. the voltage drop generated by the current passes through the resistor R4) is designed to be smaller than or equal to the threshold TH and greater than the threshold voltage of the transistor MP1. The goals of turning on the transistor MP1 and preventing the transistor MP1 from being damaged are simultaneously achieved, therefore.

On the other hand, the gate, the source and the drain of the transistor MP3 are coupled to a node N6, a negative voltage source VGL_2 and the node N2. The gate, the source and the drain of the transistor MN8 are coupled to the node N6, the negative voltage source VGL and the node N2. The resistor R5 is coupled between the node N6 and the negative voltage source VGL. The gate, the source and the drain of the transistor MP4 are coupled to a node N7, the positive voltage source VDD and the node N6. The gate, the source and the drain of the transistor MP5 are coupled to the control signal CON, the positive voltage source VDD and the node N7. The gate, the source and the drain of the transistor MP6 are coupled to the inverse signal CONB, a node N8 and the node N7. The gate, the source and the drain of the transistor MP7 are coupled to the node N8, the positive voltage source VDD and the node N8. The current source I2 is coupled between the node N8 and the negative voltage source VSS. Note that, the voltage difference between the voltage of the negative voltage sources VGL_2 and VGL is smaller than or equal to the threshold TH and is greater than the threshold voltage of the transistor MN1. For example, when the threshold TH is 5 volts, the voltage of the negative voltage source VGL_2 may be a sum of the voltage of the negative voltage source VGL and 5 volts (i.e. VGL_2=VGL+5).

When the control signal CON indicates turning off the transistor MN1, the control signal CON turns off the transistor MP5 and the inverse signal CONB turns on the transistor MP6. The transistors MP4 and MP7 form a current mirror to generate an appropriate voltage VN6 for turning off the transistor MP3 and turning on the transistor MN8. Via adjusting the current passing through the transistor MP4 and the resistor R5, the voltage VN2 of the node N2 substantially equals the voltage of the negative voltage source VGL and the transistor MN1 is in the cut off status. When the control signal CON indicates turning on the transistor MN1, the control signal CON turns on the transistor MP5 and the inverse signal CONB turns off the transistor MP6, such that the transistor MP4 is in the cut off status and the voltage VN6 of the node N6 substantially equals the voltage of the negative voltage source VGL. In such condition, the transistor MN8 is in the cut off status and the transistor MP3 is turned on, such that the voltage VN2 of the node N2 substantially equals the voltage of the negative voltage source VGL_2. Since the voltage difference between the voltages of the negative voltage sources VGL_2 and VGL is smaller than or equal to the threshold TH and is greater than the threshold voltage of the transistor MN1, the transistor MN1 is turned on without being damaged. Via the voltage generating unit 400, the driving module 40 switches the conducting statuses of the transistors MP1 and MN1 according to the control signal CON, to generate the appropriate output voltage VOUT at the output end OUT as the driving signal used for driving the display component in the display device. Further, the voltage generating unit 400 limits the voltage difference between the gate and the source of each of the transistors MP1 and MN1 to be lower than the threshold TH, to avoid the transistor MP1 and MN1 are damaged.

Note that, the transistors MN4, MN7, MP4 and MP7 need to be realized by the special process in this embodiment.

When the display device utilizes a plurality of driving modules 40 to generate driving signals for driving a plurality of display components (e.g. the scan line signals of a plurality of scan lines), the plurality of driving modules 40 may share part of the components since the display device generally enables single scan line at once. For example, the plurality of driving module 40 may share the transistors MN7, MP7 and the current sources I1, I2. That is, the node N5 of each of the plurality of driving modules 40 are connected and the node N8 of each of the plurality of driving modules 40 are connected, so as to use the single set of the transistors MN7, MP7 and the current sources I1, I2 to perform the operations. The power consumption of the plurality of driving modules 40 can be significantly reduced, therefore.

In addition, the driving module 40 generates a current I1 passing through the resistor R4 and a current I2 passing through the resistor R5 when the control signal CON indicates turning on the transistor MP1 and tuning off the transistor MN1; and the driving module 40 does not consume static current when the control signal CON indicates turning off the transistor MP1 and turning on the transistor MN1. In other words, the driving module 40 consumes the current only at the time of turning on the transistor MP1 and tuning off the transistor MN1. If the display device utilizes a plurality of driving modules 40 to driving the scan lines, only one of the plurality of driving modules 40 consumes current at the same time since only single scan line is enabled at the same time. The power consumption of the display device is further decreased.

Figure 5:
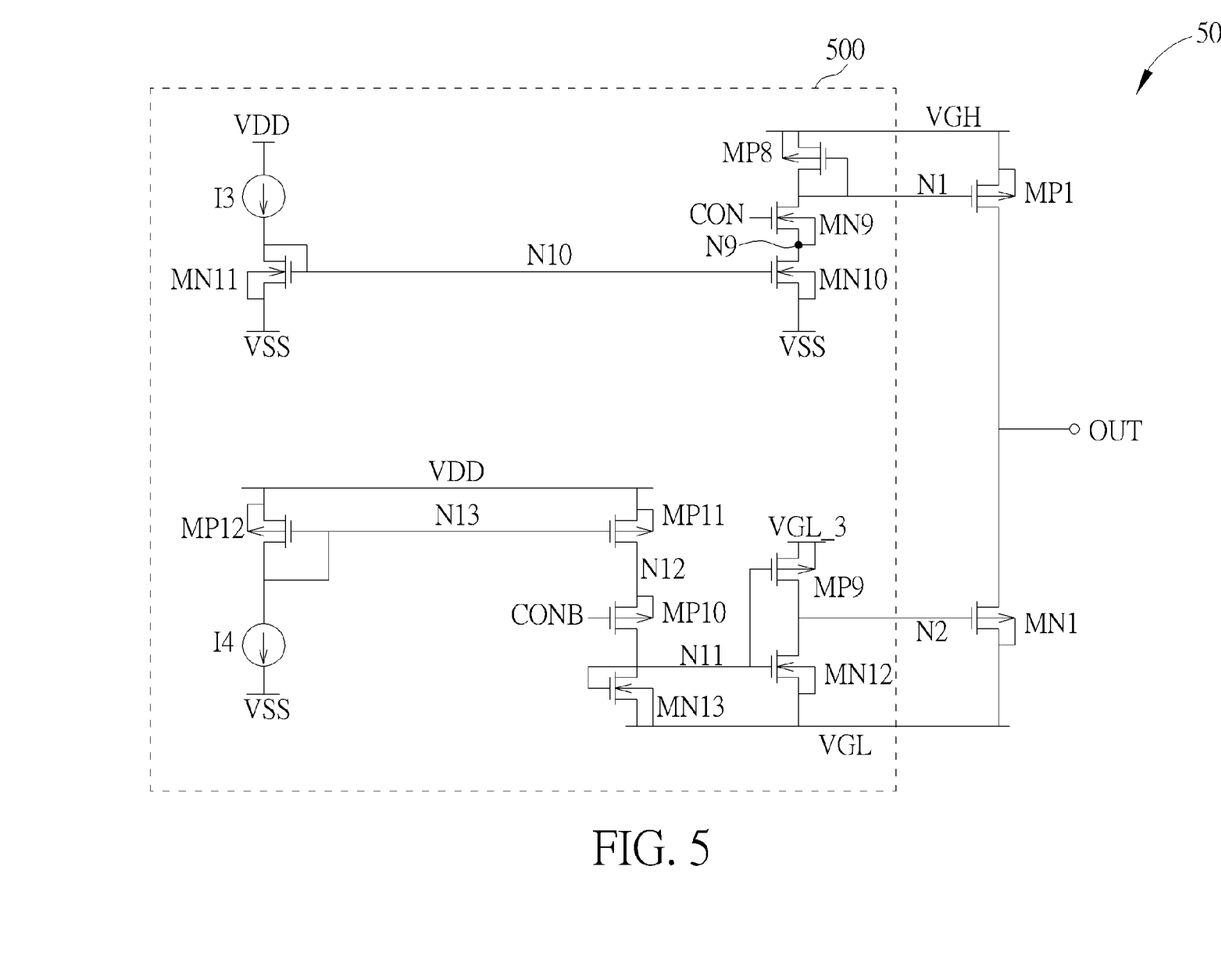
FIG. 5 is a schematic diagram of another driving module according to an embodiment of the present invention.

Please refer to FIG. 5, which is a schematic diagram of a driving module 50 according to an embodiment of the present invention. The driving module 50 shown in FIG. 5 is similar to the driving module 10 shown in FIG. 1, thus the components with the similar functions use the same symbols. The driving module 50 comprises the transistors MP1, MN1 and a voltage generating unit 500, wherein the coupling relationships between the transistors MP1 and MN1 are similar to those between the transistors MP1 and MN1 shown in FIG. 1. In the FIG. 5, the voltage generating unit 500 comprises transistors MN9-MN13, MP8-MP12, and current sources I3, I4. The gate, the source and the drain of the transistor MP8 are coupled to the node N1, the positive voltage source VGH and the node N1. The gate, the source and the drain of the transistor MN9 are coupled to the control signal CON, the node N1 and a node N9. The gate, the source and the drain of the transistor MN10 are coupled to a node N10, the negative voltage source VSS (e.g. ground) and the node N9. The gate, the source and the drain of the transistor MN11 are coupled to the node N10, the negative voltage source VSS and the node N10. The current source I3 is coupled between the node N10 and the positive voltage source VDD. The transistor MP8 may be regarded as a resistor coupled between the positive voltage source VGH and the node N1 and the transistors MN10 and MN11 forms a current mirror.

When the control signal CON indicates tuning off the transistor MP1, the control signal CON turns off the transistor MN9. The voltage VN1 of the node N1 substantially equals the voltage of the positive voltage source VGH. Since the voltage across the gate and the source of the transistor MP1 is 0, the transistor MP1 is in the cut off status and is not damaged. When the control signal CON indicates turning on the transistor MP1, the transistor MN9 is turned on by the control signal CON and the current mirror consisted of the current source I3 and the transistors MN10, MN11 generates the current passing through the transistors MN9 and MP8, to generate the appropriate voltage VN1 at the node N1 and to turn on the transistor MP1. Via adjusting the current passing through the transistors MN9 and MP8, the voltage difference between the voltage VN1 turning on the transistor MP1 and the voltage of the positive voltage source VGH (i.e. the voltage drop generated by the current passing through the transistor MP8) is smaller than or equal to the threshold TH and the voltage difference between the voltage VN1 turning on the transistor MP1 and the voltage of the positive voltage source VGH is greater than the threshold voltage of the transistor MP1. The transistor MP1 is turned on and would not be damaged, therefore.

On the other hand, the gate, the source and the drain of the transistor MP9 are coupled to a node N11, a negative voltage source VGL_3 and the node N2. The gate, the source and the drain of the transistor MN12 are coupled to the node N11, the negative voltage source VGL and the node N2. The gate, the source and the drain of the transistor MN13 are coupled to the node N11, the negative voltage source VGL and the node N11. The gate, the source and the drain of the transistor MP10 are coupled to an inverse signal CONB of the control signal CON, a node N12 and the node N11. The gate, the source and the drain of the transistor MP11 are coupled to a node N13, the positive voltage source VDD and the node N12. The gate, the source and the drain of the transistor MP12 are coupled to the node N13, the positive voltage source VDD and the node N13. The current source I4 is coupled between the node N13 and the negative voltage source VSS. The transistor MN13 may be regarded as a resistor coupled to between the negative voltage source VGL and the node N11 and the current source I4 and the transistors MP11, MP12 form a current mirror. Note that, the voltage difference between the voltage of the negative voltage sources VGL_3 and VGL is smaller than or equal to the threshold TH and the voltage difference between the voltage of the negative voltage sources VGL_3 and VGL is greater than the threshold voltage of the transistor MN1. For example, when the threshold TH is 5 volts, the voltage of the negative voltage source VGL_3 may be a sum of the voltage of the negative voltage source VGL and 5 volts (i.e. VGL_3=VGL+5). The inverse signal CONB may be acquired by inversing the control signal CON via an inverter (not shown in FIG. 5). The principles of inversing the signal via the inverter should be well known to those with ordinary skill in the art, and are not described herein for brevity.

When the control signal CON indicates turning off the transistor MN1, the inverse signal CONB turns on the transistor MP10 and the current mirror consisted of the current source I4 and the transistors MP11, MP12 generates a current passing through the transistor MN13, for generating an appropriately voltage VN11 to turn off the transistor MP9 and to turn on the transistor MN12. In such a condition, the voltage VN2 of the node N2 substantially equals the voltage of the negative voltage source VGL and the transistor MN1 is in the cut off status. When the control signal CON indicates turning on the transistor MN1, the transistor MP10 is turned off by the inverse signal CONB. The voltage VN11 of the node N11 substantially equals the voltage of the negative voltage source VGL. The transistor MN12 is turned off and the transistor MP9 is turned on, therefore. The voltage VN2 of the node N2 becomes substantially equal to the voltage of the negative voltage source VGL_3, therefore. Since the voltage difference between the voltages of the negative voltage sources VGL_3 and VGL is smaller than or equal to the threshold TH and is greater than the threshold voltage of the transistor MN1, the transistor MN1 is turned on without being damaged. Via the voltage generating unit 500, the driving module 50 switches the conducting statuses of the transistors MP1 and MN1 according to the control signal CON, to generate the appropriate output voltage VOUT at the output end OUT as the driving signal used for driving the display component in the display device. Further, the voltage generating unit 500 limits the voltage difference between the gate and the source of each of the transistors MP1 and MN1 to be lower than the threshold TH, to avoid the transistor MP1 and MN1 are damaged.

In this embodiment, the transistors MN9 and MN10 need to be implemented in the special process.

Note that, when the display device utilizes a plurality of driving modules 50 to generate driving signals for driving a plurality of display components (e.g. the scan line signals of a plurality of scan lines), the plurality of driving modules 50 may share part of the components since the display device generally enables single scan line at once. For example, the plurality of driving module 50 may share the transistors MN11, MP12 and the current sources I3, I4. That is, the node N10 of each of the plurality of driving modules 50 are connected and the node N13 of each of the plurality of driving modules 50 are connected, so as to use the single set of the transistors MN11, MP12 and the current sources I3, I4 to perform the operations. The power consumption of the plurality of driving modules 50 can be significantly reduced, therefore.

Figure 6:
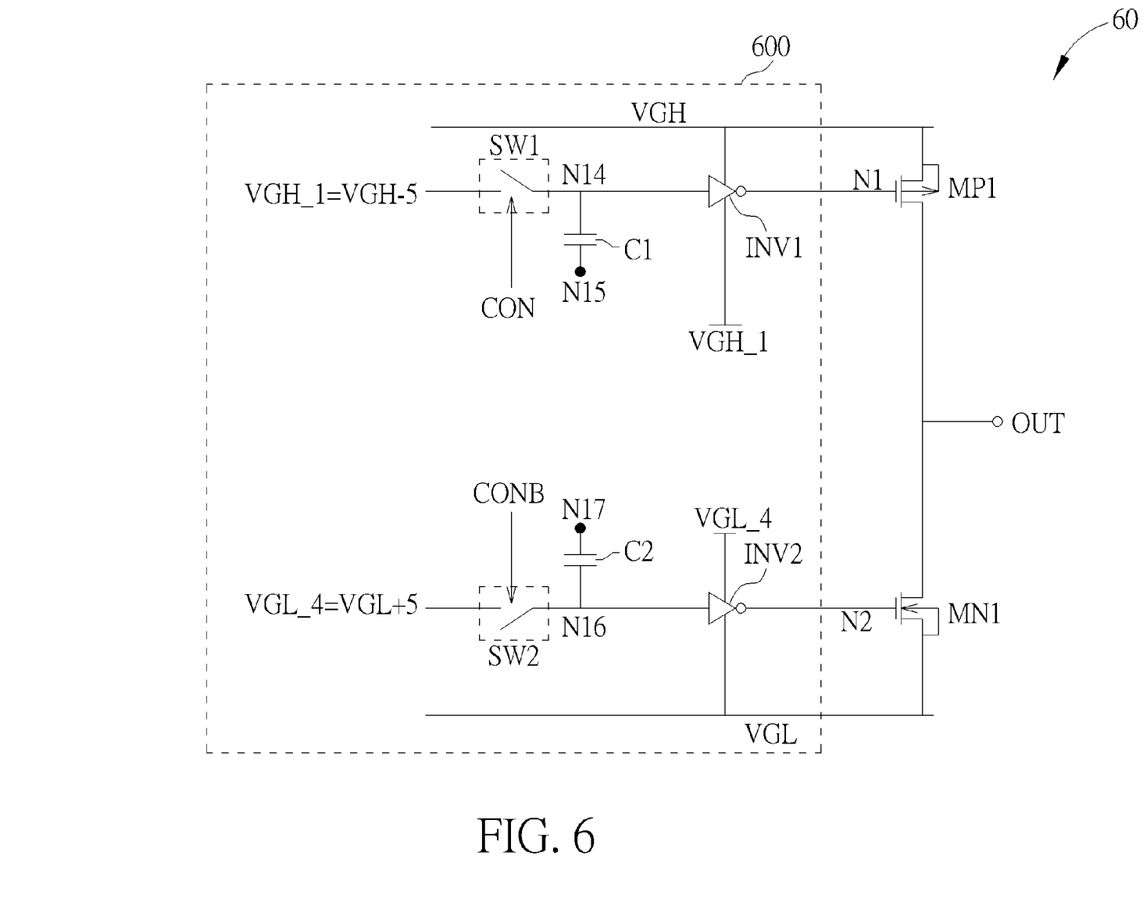
FIG. 6 is a schematic diagram of another driving module according to an embodiment of the present invention.

Please refer to FIG. 6, which is a schematic diagram of a driving module 60 according to an embodiment of the present invention. The driving module 60 shown in FIG. 6 is similar to the driving module 10 shown in FIG. 1, thus the components with the similar functions use the same symbols. The driving module 60 comprises the transistors MP1, MN1 and a voltage generating unit 600, wherein the coupling relationships between the transistors MP1 and MN1 are similar to those between the transistors MP1 and MN1 shown in FIG. 1. In the FIG. 6, the voltage generating unit 600 comprises inverters INV1, INV2, switches SW1, SW2 and capacitors C1, C2. The inverter INV1 is coupled between the nodes N1 and N14. The capacitor C1 is coupled between the nodes N14 and N15. The switch SW1 is utilized for adjusting the connection between the node N14 and a positive voltage source VGH_1 according to the control signal CON. The voltage difference between the voltage of the positive voltage sources VGH_1 and VGH is smaller than or equal to the threshold TH and is greater than the threshold voltage of the transistor MP1. For example, when the threshold TH is 5 volts, the voltage of the positive voltage source VGH_1 may be a difference between the voltage of the positive voltage source VGH and 5 volts (i.e. VGH_1=VGH−5).

When the control signal CON indicates turning off the transistor MP1, the control signal CON controls the switch SW1 to conduct the connection between the positive voltage source VGH_1 and the node N14. In such a condition, the inverter INV1 adjusts the voltage VN1 of the node N1 to the voltage of the positive voltage source VGH and the transistor MP1 is in the cut off status. When the control signal CON indicates turning on the transistor MP1, the control signal CON controls the switch SW1 to disconnect the connection between the positive voltage source VGH_1 and the node N14. At this time, the voltage VN15 of the node N15 increases by the threshold TH according to the control signal CON, for making the inverter INV1 to adjust the voltage VN1 of the node N1 to the voltage of the positive voltage source VGH_1 and turning on the transistor MP1.

On the other hand, the inverter INV2 is coupled between the nodes N2 and N16, the capacitor C2 is coupled between the nodes N16 and N17, and the switch SW2 adjusts a connection between a negative voltage source VGL_4 and the node 16 according to an inverse signal CONB of the control signal CON. Note that, a voltage difference between the voltage of the negative voltage sources VGL_4 and VGL is smaller than or equal to the threshold TH, and the voltage difference between the voltage of the negative voltage sources VGL_4 and VGL is greater than the threshold voltage of the transistor MN1. For example, when the threshold TH is 5 volts, the voltage of the negative voltage source VGL_4 may be a sum of the voltage of the negative voltage source VGL and 5 volts (i.e. VGL_4=VGL+5). The inverse signal CONB may be acquired by inversing the control signal CON via an inverter (not shown in FIG. 6). The principles of inversing the signal via the inverter should be well known to those with ordinary skill in the art, and are not described herein for brevity.

When the inverse signal CONB indicates turning off the transistor MN1, the inverse signal CONB controls the switch SW2 to conduct the connection between the negative voltage source VGL_4 and the node N16. In such a condition, the inverter INV2 adjusts the voltage VN2 of the node N2 to the voltage of the negative voltage source VGL and the transistor MN1 is in the cut off status. When the inverse signal CONB indicates turning on the transistor MN1, the inverse signal CONB controls the switch SW2 to disconnect the connection between the negative voltage source VGL_4 and the node N16. At this time, the voltage VN17 of the node N17 decreases the threshold TH according to the control signal CON, for making the inverter INV2 to adjust the voltage VN2 of the node N2 to the voltage of the negative voltage source VGL_4 and turning on the transistor MN1. Via the voltage generating unit 600, the driving module 60 switches the conducting statuses of the transistors MP1 and MN1 according to the control signal CON, to generate the appropriate output voltage VOUT at the output end OUT as the driving signal used for driving the display component in the display device. Further, the voltage generating unit 600 limits the voltage difference between the gate and the source of each of the transistors MP1 and MN1 to be lower than the threshold TH, to avoid the transistor MP1 and MN1 are damaged.

Figure 7:
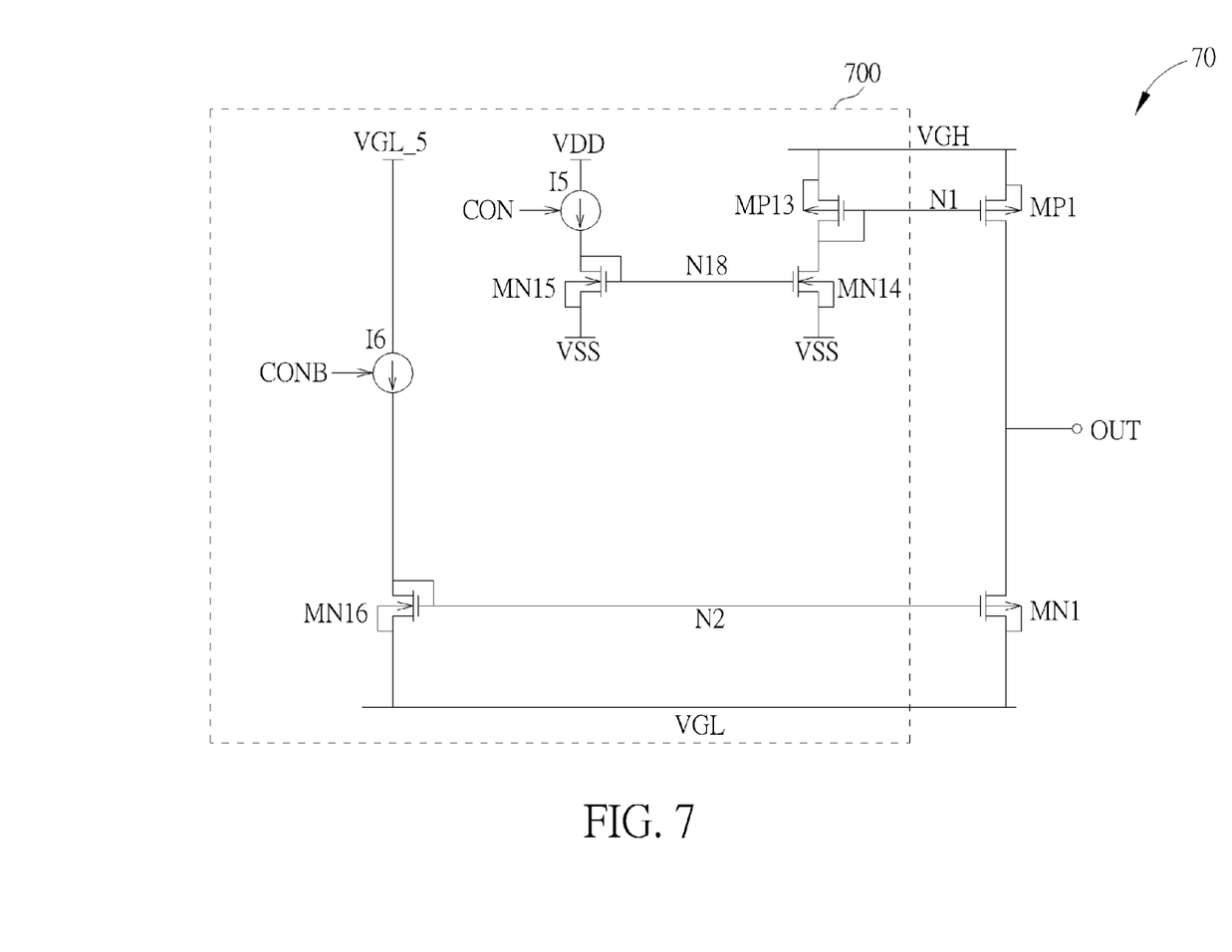
FIG. 7 is a schematic diagram of another driving module according to an embodiment of the present invention.

Please refer to FIG. 7, which is a schematic diagram of a driving module 70 according to an embodiment of the present invention. The driving module 70 shown in FIG. 7 is similar to the driving module 10 shown in FIG. 1, thus the components with the similar functions use the same symbols. The driving module 70 comprises the transistors MP1, MN1 and a voltage generating unit 700, wherein the coupling relationships between the transistors MP1 and MN1 are similar to those between the transistors MP1 and MN1 shown in FIG. 1. In FIG. 7, the voltage generating unit 700 comprises transistors MN14-MN16, MP13 and current sources I5, I6. The gate, the source and the drain of the transistor MP13 are coupled to the node N1, the positive voltage source VGH and the node N1. The gate, the source and the drain of the transistor MN14 are coupled to a node N18, the negative voltage source VSS (e.g. ground) and the node N1. The gate, the source and the drain of the transistor MN15 are coupled to the node N18, the negative voltage source VSS and the node N18. The current source is coupled between the positive voltage source VDD and the node N18. In short, the transistors MP13, MP1 form a current mirror and the current source I5 and the transistors MN14, MN15 form another current mirror.

When the control signal CON indicates turning off the transistor MP1, the control signal CON controls the current source I5 to stop outputting the current to the transistor MN15. The transistor MP1 is in the cut off status and is not damaged. When the control signal CON indicates turning on the transistor MP1, the control signal CON controls the current source I5 to output the current to the transistor MN15. The transistor MP1 is conducted via the current mirror consisted of the current source I5 and the transistor MN14, MN15 and the current mirror consisted of the transistors MP13, MP1. The voltage difference between the voltage VN1 conducting the transistor MP1 and the voltage of the positive voltage source VGH (i.e. the voltage drop generated by the current passes through the transistor MP13) is designed to be smaller than or equal to the threshold TH, to avoid the transistor MP1 is damaged.

In addition, the gate, the source and the drain of the transistor MN16 are coupled to the node N2, the negative voltage source VGL and the node N2. The current source I6 is coupled between the node N2 and a negative voltage source VGL_5. In short, the transistors MN16 and MN1 form a current mirror. Note that, a voltage difference between the voltage of the negative voltage sources VGL_5 and VGL is smaller than or equal to the threshold TH, and the voltage difference between the voltage of the negative voltage sources VGL_5 and VGL is greater than the threshold voltage of the transistor MN1. For example, when the threshold TH is 5 volts, the voltage of the negative voltage source VGL_5 may be a sum of the voltage of the negative voltage source VGL and 5 volts (i.e. VGL_5=VGL+5).

When the control signal CON indicates turning off the transistor MN1, the inverse signal CONB of the control signal CON controls the current source I6 to stop outputting current MN16. Thus, the transistor MN1 is in the cut off status. When the control signal CON indicates turning on the transistor MN1, the inverse signal CONB controls the current source I6 to output current to the transistor MN16, so as to turn on the transistor MN1. The voltage difference between the voltage VN2 turning on the transistor MN1 and the voltage of the negative voltage source VGL (i.e. the voltage drop generated by the current passes the transistor MN16) is designed to be smaller than or equal to the threshold voltage TH, for avoiding damaging the transistor MN1. Via the voltage generating unit 700, the driving module 70 switches the conducting statuses of the transistors MP1 and MN1 according to the control signal CON, to generate the appropriate output voltage VOUT at the output end OUT as the driving signal used for driving the display component in the display device. Further, the voltage generating unit 700 limits the voltage difference between the gate and the source of each of the transistors MP1 and MN1 to be lower than the threshold TH, to avoid the transistor MP1 and MN1 are damaged.

In this example, the driving module 70 does not require passive components such as the resistors and the capacitors. However, the transistors MN1, MN14-MN16, MP1 and MP13 are required to be implemented by the special process.

According to difference applications and design concepts, those with ordinary skill in the art may observe appropriate alternations and modifications. For example, the resistors R1-R3 of the driving module 20 shown in FIG. 2 and the resistors R4 and R5 of the driving module 40 shown in FIG. 4 may be realized by the transistors for reducing the effects of the process variations. In addition, the threshold TH utilized for limiting the voltage across the gate and the source of each of the transistors MP1 and MN1 may be appropriately changed. For example, the voltage difference between the voltage VN1 and the positive voltage source VGH is smaller than a threshold TH1 and that between the voltage VN2 and the negative voltage source VGL is smaller than another threshold TH2 in FIG. 1.

To sum up, the driving modules of the above embodiments utilize the voltage generating unit to limit the voltage across the gate and the source of each of the transistor in the output stage, to avoid the transistors in the output stage are damaged. Further, the driving modules of the above embodiments do not need components of the convention high-voltage process and can be realized by the components of the special process, which allows the transistor not to be damaged by the huge voltage differences across the source and the drain of the transistor and across the gate and the drain of the transistor. The manufacture cost and the manufacture time are significantly reduced, therefore.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A driving module, for a display device, comprising:
a first transistor, comprising a gate coupled to a first node, a drain coupled to an output end, and a source coupled to a first positive voltage source;
a second transistor, comprising a gate coupled to a second node, a drain coupled to the output end, and a source coupled to a first negative voltage source; and
a voltage generating unit, coupled to an input end, a second positive voltage source and a second negative voltage source for generating a first voltage at the first node and a second voltage at the second node according to a control signal from the input end;
wherein a voltage difference between a first positive voltage of the first positive voltage source and the first voltage is smaller than a first threshold and a voltage difference between a first negative voltage of the first negative voltage source and the second voltage is smaller than a second threshold;
wherein the voltage generating unit comprises:
a third transistor, comprising a gate coupled to the first node, a source coupled to the first positive voltage source, and a drain coupled to the first node;
a fourth transistor, comprising a gate coupled to the control signal, a source coupled to a third node, and a drain coupled to the first node;
a fifth transistor, comprising a gate coupled to a fourth node, a source coupled to the third node, and a drain coupled to the second negative voltage source;
a sixth transistor, comprising a gate coupled to the fourth node, a source coupled to the second negative voltage source, and a drain coupled to the fourth node; and
a current source, coupled between the second positive voltage source and the fourth node;
wherein a voltage range of the control signal is between the second positive voltage and the second negative voltage.

2. A driving module, for a display device, comprising:
a first transistor, comprising a gate coupled to a first node, a drain coupled to an output end, and a source coupled to a first positive voltage source;
a second transistor, comprising a gate coupled to a second node, a drain coupled to the output end, and a source coupled to a first negative voltage source; and
a voltage generating unit, coupled to an input end, a second positive voltage source and a second negative voltage source for generating a first voltage at the first node and a second voltage at the second node according to a control signal from the input end;
wherein a voltage difference between a first positive voltage of the first positive voltage source and the first voltage is smaller than a first threshold and a voltage difference between a first negative voltage of the first negative voltage source and the second voltage is smaller than a second threshold;
wherein the voltage generating unit comprising:
a third transistor, comprising a gate coupled to a third node, a source coupled to a third negative voltage source, and a drain coupled to the second node;
a fourth transistor, comprising a gate coupled to the third node, a source coupled to the first negative voltage source, and a drain coupled to the second node;
a fifth transistor, comprising a gate coupled to the third node, a source coupled to the first negative voltage source, and a drain coupled to the third node;
a sixth transistor, comprising a gate coupled to an inverse signal of the control signal, a source coupled to a fourth node, and a drain coupled to the third node;
a seventh transistor, comprising a gate coupled to a fifth node, a source coupled to the second positive voltage source, and a drain coupled to the fourth node;
a eighth transistor, comprising a gate coupled to the fifth node, a source coupled to the second positive voltage source, and a drain coupled to the fifth node; and
a current source, coupled between the fifth node and the second negative voltage source;
wherein a voltage range of the inverse signal is between the second positive voltage and the second negative voltage.

3. A display device, comprising:
a plurality of displaying components, drove by a plurality of driving signals; and
a plurality of driving modules, wherein each of the plurality of driving modules comprises:
a first transistor, comprising a gate coupled to a first node, a drain coupled to an output end, and a source coupled to a first positive voltage source;
a second transistor, comprising a gate coupled to a second node, a drain coupled to the output end, and a source coupled to a first negative voltage source; and
a voltage generating unit, coupled to an input end, a second positive voltage source and a second negative voltage source for generating a first voltage at the first node and a second voltage at the second node to output one of the plurality of driving signal;
wherein a voltage difference between a first positive voltage of the first positive voltage source and the first voltage is smaller than a first threshold and a voltage difference between a first negative voltage of the first negative voltage source and the second voltage is smaller than a second threshold;
wherein the voltage generating unit comprises:
a third transistor, comprising a gate coupled to the first node, a source coupled to the first positive voltage source, and a drain coupled to the first node;
a fourth transistor, comprising a gate coupled to the control signal, a source coupled to a third node, and a drain coupled to the first node;
a fifth transistor, comprising a gate coupled to a fourth node, a source coupled to the third node, and a drain coupled to the second negative voltage source;
a sixth transistor, comprising a gate coupled to the fourth node, a source coupled to the second negative voltage source, and a drain coupled to the fourth node; and
a current source, coupled between the second positive voltage source and the fourth node;
wherein a voltage range of the control signal is between the second positive voltage and the second negative voltage.

4. A display device, comprising:
a plurality of displaying components, drove by a plurality of driving signals; and
a plurality of driving modules, wherein each of the plurality of driving modules comprises:

a first transistor, comprising a gate coupled to a first node, a drain coupled to an output end, and a source coupled to a first positive voltage source;

a second transistor, comprising a gate coupled to a second node, a drain coupled to the output end, and a source coupled to a first negative voltage source; and a voltage generating unit, coupled to an input end, a second positive voltage source and a second negative voltage source for generating a first voltage at the first node and a second voltage at the second node to output one of the plurality of driving signal;

wherein a voltage difference between a first positive voltage of the first positive voltage source and the first voltage is smaller than a first threshold and a voltage difference between a first negative voltage of the first negative voltage source and the second voltage is smaller than a second threshold;

wherein the voltage generating unit comprises:

a third transistor, comprising a gate coupled to a third node, a source coupled to a third negative voltage source, and a drain coupled to the second node;

a fourth transistor, comprising a gate coupled to the third node, a source coupled to the first negative voltage source, and a drain coupled to the second node;

a fifth transistor, comprising a gate coupled to the third node, a source coupled to the first negative voltage source, and a drain coupled to the third node;

a sixth transistor, comprising a gate coupled to an inverse signal of the control signal, a source coupled to a fourth node, and a drain coupled to the third node;

a seventh transistor, comprising a gate coupled to a fifth node, a source coupled to the second positive voltage source, and a drain coupled to the fourth node;

a eighth transistor, comprising a gate coupled to the fifth node, a source coupled to the second positive voltage source, and a drain coupled to the fifth node; and a current source, coupled between the fifth node and the second negative voltage source;

wherein a voltage range of the inverse signal is between the second positive voltage and the second negative voltage.

* * * * *